Figure 1:
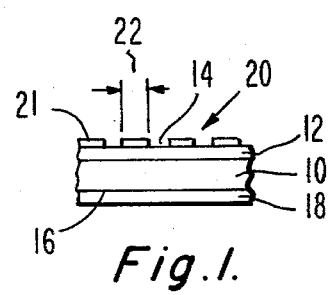

United States Patent [19]

Napoli

[11] 4,228,315
[45] Oct. 14, 1980

[54] SOLAR CELL GRID PATTERNS

[75] Inventor: Louis S. Napoli, Hamilton Square, N.J.

[73] Assignee: RCA Corporation, New York, N.Y.

[21] Appl. No.: 36,039

[22] Filed: May 4, 1979

[51] Int. Cl.³ .......................................... H01L 31/04
[52] U.S. Cl. .................................. 136/256; 357/30; 357/68
[58] Field of Search ............... 136/89 CC; 357/30, 65, 357/68; D13/1, 4

[56] References Cited

U.S. PATENT DOCUMENTS

| | | | |
|---|---|---|---|
| 2,963,390 | 12/1960 | Dickson, Jr. | 148/1.5 |
| 3,013,232 | 12/1961 | Lubin | 338/17 |
| 3,888,697 | 6/1975 | Bogos et al. | 136/89 |
| 3,966,499 | 6/1976 | Yasui et al. | 136/206 |
| 4,084,985 | 4/1978 | Evans, Jr. | 136/89 P |
| 4,090,213 | 5/1978 | Maserjian et al. | 357/30 |
| 4,115,149 | 9/1978 | Bell | 136/89 PC |
| 4,171,989 | 10/1979 | Pryor | 136/89 CC |

OTHER PUBLICATIONS

W. D. Johnston, Jr., "Vapor-Phase-Epitaxial Growth of n-AlAs/p-GaAs Solar Cells", *J. Crystal Growth*, vol. 39, pp. 117-127 (1977).
D. E. Riemer, "Evaluation of Thick Film Materials For Use as Solar Cell Contacts", *Conf. Record, 13th IEEE Photovoltaic Specialists Conf.* (1978), pp. 603-608.
W. T. Matzen et al., "Optimized Metallization Patterns For Large-Area Silicon Solar Cells", *Conf. Record, 12th IEEE Photovoltaic Specialists Conf.* (1976), pp. 340-342.
Solarex Corporation, Rockville, Md., General Products Brochures, 1974 and 1977.
Solarex Corporation, Rockville, Md., Data Sheet 6011 (1977).

*Primary Examiner*—Aaron Weisstuch
*Attorney, Agent, or Firm*—Samuel Cohen; William Squire

[57] ABSTRACT

A grid pattern for a solar cell of the type including a base layer of one conductivity type and an emitter layer of opposite conductivity type. The solar cell may have a square face and in this case the grid pattern is in the form of four symmetrical sub-patterns, each in a different quadrant of the square. Each such sub-pattern comprises a set of nested V shaped grid conductors, the apices of which lie on a common diagonal of the square and the ends of which connect to a common bus conductor at the peripheral edge of the square. Within each quadrant, the sub-pattern comprises a symmetrical pattern relative to a diagonal of the square. The pattern reduces the effect of line and sheet resistance and thereby permits more of the photon induced charge carriers to be collected and also permits a relatively large part of the cell face area to be available for the reception of photons.

12 Claims, 7 Drawing Figures

U.S. Patent  Oct. 14, 1980  Sheet 1 of 2  4,228,315

SOLAR CELL GRID PATTERNS

The present invention relates to conductive grid patterns for solar cells.

Widespread research is now in progress for the development of solar cells (devices which convert light to electrical energy) which are cost competitive with other forms of energy. The current such a cell produces is proportional to the intensity of the light incident on the cell and the area of the cell exposed to the light.

One type of solar cell employed comprises a base region or layer formed of a semiconductor material of one conductivity type below an emitter region or layer of opposite conductivity type. A metallized conductor on the surface of the base region forms one electrode. A grid on the surface of the emitter region, which surface is the light receiving surface, forms another electrode. Solar photons reaching the surface of the emitter region pass through this region into the base region and generate electron-hole pairs in the base region. Depending on the conductivity type of the emitter and base regions, electrons or holes from the base region become majority carries in the emitter region which travel to the grid electrode on the surface of the emitter region and are collected there.

The electrons or holes when traveling through the emitter layer to the grid electrode must overcome the resistivity of the emitter layer. This is known as sheet resistance. This electrical resistance is considerably higher than that in a metal such as silver or copper. The grid electrode minimizes the effect of this sheet resistance by reducing the physical distance which the majority carriers must travel in the emitter layer to reach the nearest charge collecting element.

Having reached an element of the grid electrode, a majority carrier must overcome a second resistance known as contact resistance before it can enter that element. This is the resistance at the interface of the electrode with the emitter layer.

A third factor which affects the amount of power produced by a solar cell is referred to as the shadowing effect. A solar cell face has a given area which may be exposed to incident solar energy. The grid pattern over that cell face reduces the area of the cell face which is exposed to the light. This cell face area is, in effect, shadowed by the elements of the grid. It is desirable to reduce to a minimum such shadowing so as to make more of the image receiving surface available as a receptor of photons. On the other hand, if the number of elements in the grid is reduced, the losses due to sheet resistance are increased so the designer is faced with the task of reconciling these conflicting requirements.

A fourth factor affecting the efficiency of a solar cell is the resistance of the electrodes themselves. Once the majority carriers reach the electrodes they must travel along the electrodes until they reach a common bus. The further that the majority carriers travel along the electrodes to reach the bus the greater the resistance loss they suffer and, therefore, the less power that is available. The present invention is directed to a grid pattern which provides increased power output as compared to prior art grid patterns for a given cell size.

A solar cell for generating electricity in response to incident light embodying the present invention comprises a conductive grid pattern, made up of symmetrical sub-patterns, on the surface of the emitter. Each sub-pattern includes a plurality of spaced, V shaped nested elements. The ends of the V terminate in bus means and the apices of the V's lie along a line that passes through the bus means. In one form of the invention in which the cell is of rectangular shape, each bus means comprises two buses, one at one edge of the rectangle and the other at an adjacent edge, the two buses joining one another at right angles, at a corner of the rectangle, and the apices of the V's lie along a line that passes through this corner.

Figure 2:
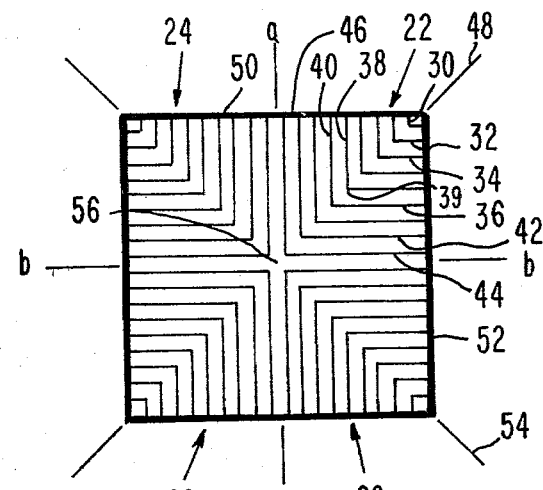
Figure 7:
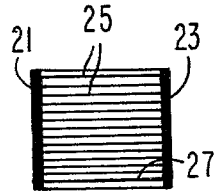
Figure 4:
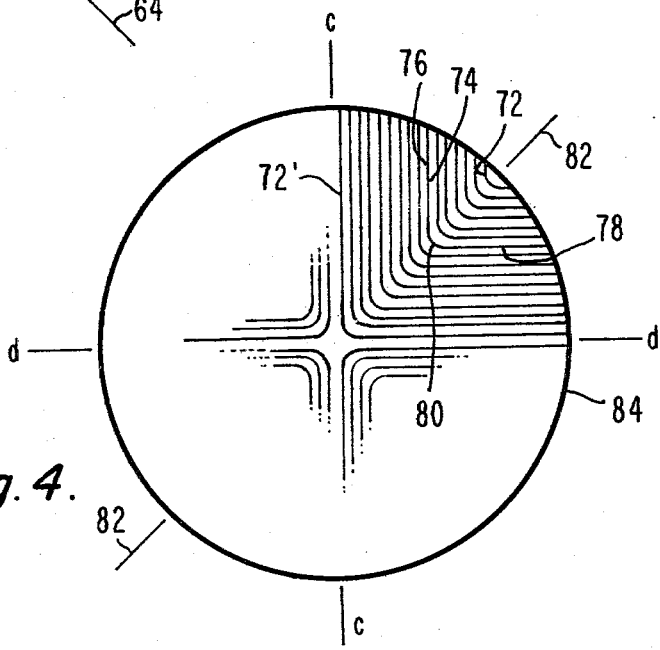
Figure 5:
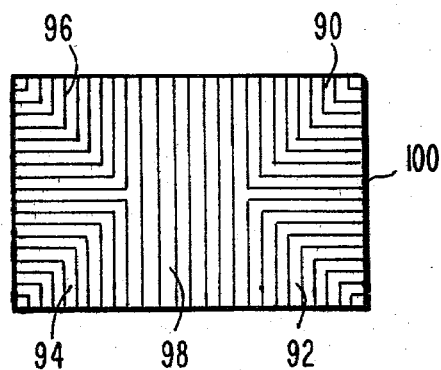
Figure 6:
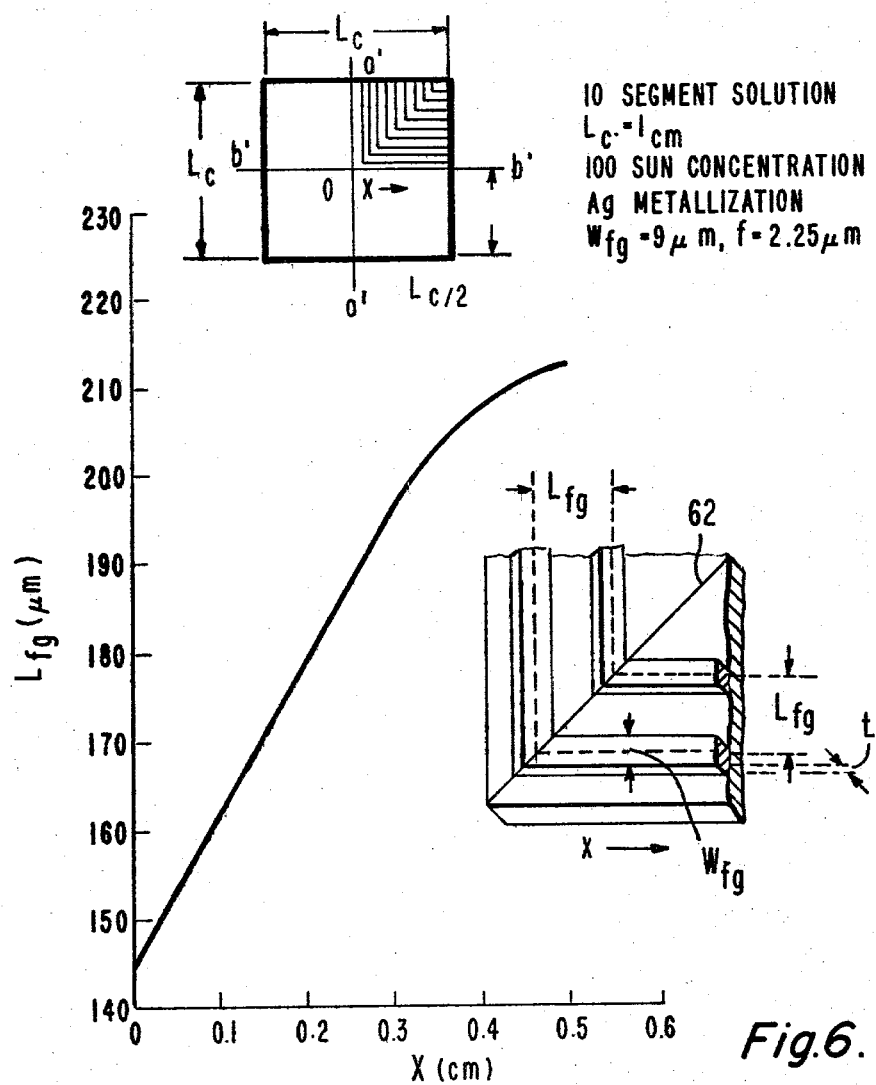

In the drawing:

FIG. 1 is a side elevational view of a portion of a solar cell in accordance with one embodiment of the present invention, FIGS. 2–5 are plan views of different embodiments of solar cells in accordance with the present invention, FIG. 6 illustrates the relation between the spacing of the grid members in one grid pattern of a specific embodiment of FIG. 2 and the distance from the center of the cell, and FIG. 7 is a plan view of one type of prior art grid structure.

In FIG. 1 a solar cell comprises a layer 10 of semiconductor base material which is photosensitive. Layer 10 may be silicon or some other semiconductor material. An emitter layer 12 which may be formed of the same semiconductor material as the base, has an upper cell face 14 which is exposed to solar light. Layer 12 may be either N or P conductivity type and layer 10 is of opposite conductivity type. An anti-reflection coating (not shown) is over the emitter layer. An electrode 18 formed of a good electrical conductor, usually gold or silver, is on the lower surface 16 of the cell. A metallized electrically conductive grid pattern 20 is located on the cell face 14 of the layer 12. The pattern 20 and the electrode 18 are highly electrically conductive with respect to the semiconductive material of layers 10 and 12. The portion of layer 12 not covered by the grid pattern 20 represents the active cell face.

Solar light incident upon the active cell face penetrates the layers 12 and then 10 to produce electrical current in a well known manner. The light penetrating into layer 10 produces holes or electrons which travel through the doped layer 12 as majority carriers to the grid pattern 20. The layer 12 is more commonly referred to as an emitter and the layer 10 as a base.

When light penetrates the layers 12 and 10 and produces majority carriers which travel through the layer 12 these carriers must travel to the grid structure 20. The resistance presented by the layer 12 for these carriers is known as sheet resistance. The fractional power loss due to sheet resistance will be hereinafter referred as $F_{SR}$. The resistance presented by the grid structure 20 to the reception of the majority carriers from the layer 12 is the contact resistance. The fractional power loss due to contact resistance will be referred to hereinafter as $F_C$. That portion of the layer 12 which is shadowed by the grid structure, such as at 22, is hereinafter referred to as a fractional power loss due to shadowing $F_S$. As the current travels along each of the grid members forming the grid structure 20 there is a fractional power loss due to a voltage drop in the grid line caused by the resistance in the grid line. This will be referred to hereinafter as $F_{LD}$. The present invention relates to a structure in which power loss attributable to the above factors, $F_{SR}$, $F_C$, $F_S$ and $F_{LD}$ is reduced.

The design of the collecting grid structure 20 of a solar cell intended for use at high solar concentration levels is critical for maximum conversion efficiency.

This is because the current density generated by the cell is so high that appreciable power may be lost in the various fractional power losses $F_{SR}$, $F_{LD}$, and $F_C$ if the grid lines are too narrow or too widely spaced. The grid shadowing of the sun may be too large if the lines are wide and finely spaced. It has been determined that a cross-hatched pattern of fine grid lines is always poorer than a straight simple line grid comprising a group of parallel lines such as that shown in FIG. 7 (see L. S. Napoli, G. A. Swartz, S. G. Liu, N. Klein, D. Fairbanks and D. Tamutus, *RCA Review*, March 1977, Volume 38, Number 1).

In FIG. 7 two parallel buses 21 and 23 are connected by a plurality of parallel grid conductors 25 on the emitter cell face 27 of a solar cell. In an optimum design, the spacing, width and thickness of the lines of the pattern should result in minimum power loss, that is, maximum power output in response to light at some reference intensity level. The cost of metallization is not a significant consideration. It is assumed that for small area concentrator cells of the type using optical devices, e.g., lenses, to concentrate solar light, the current collecting buses such as at 21 and 23, FIG. 7, are located outside the illuminated area of the cell face. The fractional power loss is computed for each parameter $F_{SR}$, $F_{LD}$, $F_C$ and $F_S$. The fractional power loss is defined as the power loss in a given area divided by the available power in that area. In computing these losses, a restraint is included on the thickness of a grid line, which is the ratio of width to thickness. This ratio is generally accepted as four, but may vary somewhat from this. The fractional power losses may be calculated in a known manner as discussed more specifically in the following articles:

1. L. S. Napoli, G. A. Swartz, S. G. Liu, N. Klein, D. Fairbanks and D. Tamutus, *RCA Review*, March 1977, Vol. 38, No. 1, p. 76.
2. D. Redfield, *RCA Review*, December 1977, Vol. 38, No. 4, p. 463.
3. A. R. Moore, *RCA Review*, December 1977, Vol. 38, No. 4, p. 486.

In performing the calculations to determine the various losses discussed above the following definitions apply:

(See FIG. 6 for graphic illustration for some of the below).

$L_c$ = the length of one side of the assumed square light receiving surface of a cell (not including the collecting bus)

$W_{fg}$ = the width of a grid line or element $L_{fg}$ = the spacing between the grid lines, center to center t = thickness of grid line n = $W_{fg}/t$ $\rho_S$ = sheet resistance of surface sheet under the grid (ohm/square)

$\rho_M$ = resistivity of the metallization material (ohm-cm)

$\rho_C$ = contact resistance (ohm-cm$^2$)

$J_m$ = current density from the cell at the maximum power point and at the stated illumination level $V_m$ = cell voltage at the maximum power point and at the stated illumination level S = shadow fraction which is the fraction of the cell face shadowed by the grid $F_{SR}$ = fractional power loss due to sheet resistance $F_{LD}$ = fractional power loss due to drop in the grid line $F_C$ = fractional power loss due to contact resistance $F_S$ = fractional power loss due to shadowing Fractional power losses for a grid of the type shown in FIG. 2 may be given as follows:

$$F_{SR} = J_m \rho_S L^2_{fg} / 12 V_m \tag{1}$$

$$F_{LD} = n J_m \rho_M L_c^2 / 24 V_m S^2 L_{fg} \tag{2}$$

$$F_C = J_m \rho_C / V_m S \tag{3}$$

$$F_S = S = W_{fg}/L_{fg} \tag{4}$$

The total fractional power loss FSUM is then:

$$FSUM = F_{SR} + F_{LD} + F_C + F_S \tag{5}$$

The fractional power output is then:

$$1 - FSUM \tag{6}$$

In the present invention the losses corresponding to $F_{LD}$ are reduced from that of a parallel grid structure of the type shown in FIG. 7 assuming the losses corresponding to $F_{SR}$, $F_S$, and $F_C$ remain the same in the present invention and in the case for the parallel grid structure. However, to further reduce the losses in a grid structure constructed in accordance with the present invention over the $F_{LD}$ savings and assuming the $F_{LD}$ losses are reduced in that structure in a manner to be described, the losses for all of the above factors including $F_{SR}$, $F_C$, and $F_C$ represented by equations 1–4 are minimized by varying the term $L_{fg}$ and S for each equation and deriving an optimum line spacing $L_{fg}$ and shadow factor S for all of these equations.

In FIG. 2 it is seen that the preferred grid pattern of the present invention comprises four mirror image sub-patterns 22, 24, 26, and 28. Sub-pattern 22 lies in the quadrant I, that is, in the upper right quadrant at the intersection of lines a—a with b—b. It is formed of a plurality of nested grid members 30, 32, 34, 36, 38, 40, 42, and 44. Each of the grid members enclose a square area with the bus 46 which is an electrical metallized conductor extending around the periphery of the cell face. Each grid member or element, for example, grid member 38, comprises two straight legs of equal length which intersect at an apex 39 which lies substantially along a diagonal 48 of the square outlined by bus 46. For example, the apices of all the grid members of sub-pattern 22 lie along the diagonal 48. The sub-pattern 26 is a mirror image of the sub-pattern 22, all apices lying on diagonal 48 and the sub-pattern 24 is a mirror image of sub-pattern 28, all apices lying on diagonal 54. The spacing between adjacent grid members 30-44 is the same and is determined as described in the above articles. One leg of each of the grid members of sub-pattern 22 terminates on a side 50 of the cell face while the other leg of each grid member terminates on side 52 of the cell face which sides intersect at right angles. The ends of each of the leg members are interconnected by the bus 46 at sides 50 and 52. As indicated above, the ratio n is assumed to be four. It can be shown mathematically that the grid pattern of FIG. 2 is of higher efficiency than a grid pattern comprising parallel straight lines running across a grid face as in FIG. 7.

In the structure of FIG. 2, each side of bus 46 on a side of the cell is used as an output bus. This lowers the average distance through which current in the grid must flow and therefore reduces the power loss due to line resistance. As each sub-pattern 22, 24, 26 and 28 is symmetrical about a diagonal line, only half of that sub-pattern, that is, the portion between a diagonal and a line bisecting the square and parallel to one of its sides, such as line a—a, need be considered in analysing the efficiency of any pattern. Two analyses are given herein. The first assumes that the line spacing $L_{fg}$ is the same throughout the half quadrant and the second that the spacing is nonuniform. The first analysis is given by equation 2 above. The total line length for the parallel grid (linear structure) pattern (FIG. 7) and that of FIG. 2 shows they are the same for any given $L_{fg}$ and S. Thus $F_S$ and $F_C$ are the same where $L_{fg} << L_C$. It can be shown mathematically that the line loss of equation (2) is one half of that for a linear grid comprising parallel grid members, FIG. 7. The total fractional power available is in any case 1-FSUM. Optimization is made by taking derivitives of 1-FSUM with respect to $L_{fg}$ and S.

Figure 3:
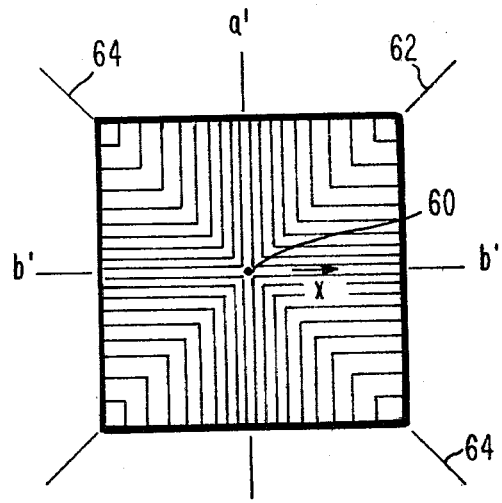

In FIG. 3 a second embodiment is illustrated. In this embodiment a square cell is divided into four quadrants by lines a'—a' and b'—b'. The grid pattern in each quadrant is identical to the other grid patterns in the remaining quadrants. The difference between the patterns of FIG. 3 and FIG. 2 is that the spacing between the grids is nonuniform in FIG. 3. FIG. 6 shows an example of this spacing for one particular implementation, which spacing decreases as the grids approach the center of the cell. FSUM is optimized with respect to $L_{fg}$ and S for each section of the cell between adjacent grid lines. The formulas used are those for the linear grid per the above articles with $L_C$ replaced by the line length of that section. As the distance from the center 60 toward a corner along one of the diagonals 62 or 64 increases, the line spacing increases. This decreases the shadow fraction $F_S$ at regions near the bus 46. This permits the grid at the edges to carry more current. This increases power more than the decrease in power due to the increase in losses from the increased sheet resistance.

In optimizing with respect to the two variables $L_{fg}$ and S, it is apparent that the values of $W_{fg}$ and t are a function of position and may have different values on a given cell face, since $W_{fg}$ and t are related to $L_{fg}$ and S by way of equation (4) and the definition of n. It is not practical to provide a grid thickness which varies over the surface of the cell since the grid thickness is constructed by a plating or evaporation process which provides a relatively uniform thickness throughout.

To avoid this impractical variation in grid thickness and retain the variable grid spacing requires that $L_{fg}$ in equations (1) and (2) be eliminated in favor of $W_{fg}$ and t by using equation (4) and the definition of n. It can be shown that FSUM is then:

$$FSUM = \frac{J_m \rho S W^2_{fg}/12\ V_m S^2 + J_m \rho_M L_c^2/12}{V_m t S + J_m \rho_C/S V_m + S} \quad (6)$$

The single variable S is then optimized with respect to $W_{fg}$ and thus t as constants and having arbitrary values, but still related by $n = W_{fg}/t$ by taking derivitives to obtain minimum values. The optimized value of S is given by:

$$S^2 = K_2/S + K_1 \text{ where } K_1 = (J_m/V_m)(\rho_M L_c^2/12t + \rho_C)$$
and
$$K_2 = J_m \rho S W^2_{fg}/6\ V_m$$

With S known, FSUM may then be computed assuming $W_{fg}$ is a constant. The quadrants are divided up into a number of L shaped segments. The mean length of each segment is substituted for the value of $L_C$ in equations (6) and (7) and the weighted average of FSUM is computed over the quadrant. The weight factor for each segment is taken as its fractional area. That is, the active area compared to the active plus shadowed area for each segment is used as a weight factor. This weight factor assumes uniform illumination.

Successive values of $W_{fg}$ and also t are assumed and the weighted average of 1-FSUM is computed. Those values of $W_{fg}$ and t which makes 1-FSUM a maximum are selected. The design will then be optimized for the two variables S and $L_{fg}$ with $W_{fg}$ and to constant over the cell for their assumed values. To determine the variation of $L_{fg}$ over the entire quadrant, equation (6) is used segment by segment, determining S for each segment, and thus, $L_{fg}$.

FIG. 6 shows a graph relating x (the distance from the cell center to its edge) to $L_{fg}$ for a square cell divided into quadrants with ten segments in each quadrant, where $L_C$ is one centimeter and the cell is illuminated at 100 sun concentrations. The grids are silver metallizations. $W_{fg}$ is 9 micrometers and t is 2¼ micrometers. FIG. 6 is for a cell in which the grid members are not uniformly spaced. As the distance from the center 60 increases, the spacing $L_{fg}$ between adjacent grid members increases.

It can be shown mathematically that with silver metallization, a linear system in which the grid pattern comprises parallel lines as shown in FIG. 7 as compared to the grid pattern of the present invention of FIG. 2, the power is increased by 2.1% at 100 suns and by 2.4% at 500 suns concentration with the present invention.

FIG. 4 illustrates another grid pattern embodying the invention, this one for a solar cell with a circular face. The patterns in the four quadrants defined by lines c—c and d—d are identical and symmetrical. The grid members 72 to 72' are formed of straight legs which are at right angles and which intersect in an arcuate apex portion. The grids may also vary from arcuate to semi-arcuate. The line spacing may be uniform or nonuniform. Each grid member such as member 74 has two straight legs such as 76 and 78 which intersect generally at arcuate apex 80 which lies on diagonal 82. The ends of legs 76 and 78 are connected by a circular bus 84 which collects electrical current produced by each of the grid members.

In FIG. 5 the solar cell is rectangular. The patterns 90, 92, 94 and 96 are similar to the patterns 22, 28, 26 and 24, respectively, of FIG. 2. Between the patterns 90–92 and 94–96 is a linear grid pattern 98 comprising a plurality of parallel grid lines. All of the grid members are interconnected at their ends by a rectangular bus 100 which surrounds the periphery of the cell face.

It should be apparent that the invention is not limited to circular or square shaped cell faces. Indeed, cell faces of polygonal or symmetrical or asymmetrical shapes can also be employed.

What is claimed is:

1. A solar cell having an electrode grid pattern on its light receiving surface comprising:
    a plurality of conductors arranged in a symmetrical pattern;
    one part of the pattern comprising, relative to a line extending toward the center region of the cell from an edge of the cell, a plurality of parallel conductors spaced from one another, each conductor subtending an angle which is bisected by the line at the crossing of that conductor with the line, each conductor terminating at both its ends at the peripheral edge portion of the cell, each conductor comprising a first portion on one side of the line which is a mirror image of a second portion on the other side of the line, each conductor thus being symmetrical relative to said line, said one part of the pattern occupying a 90° quadrant which is bisected by the line, a second part of the pattern comprising a mirror image of the first part of the pattern;

third and fourth parts of the pattern comprising a mirror image of said first and second parts of the pattern, respectively, and a common bus extending along said peripheral edge portion of the cell and in conductive contact with all of said conductors at their respective opposite ends, the spacing between different pairs of said parallel conductors being different, the spacing between those conductors closest to the peripheral edge being the greatest.

2. An electrode grid pattern as set forth in claim 1 wherein said solar cell has a substantially square light receiving surface, wherein said line comprises a diagonal of said square, and wherein each conductor comprises a first portion which is at substantially right angles to said second portion thereof.

3. An electrode grid pattern as set forth in claim 1, wherein said solar cell has a substantially rectangular light receiving surface which is not a square, wherein said line extends from one corner of the rectangle and bisects that corner, and wherein each conductor comprises a first portion which is at substantially right angles to the second portion thereof.

4. An electrode grid pattern as set forth in claim 3, further including a plurality of straight conductors in the space between the four quadrants, parallel to the shorter sides of the rectangle, and joined at opposite ends thereof to said common bus.

5. An electrode grid pattern as set forth in claim 1 wherein said solar cell has a substantially circular face, the four parts of the pattern each occupying a different 90° sector of the circle.

6. A photovoltaic solar cell for generating electricity in response to incident light comprising:

a base layer of semiconductive material of one conductivity type, an emitter layer of semiconductive material of opposite conductivity type over said base layer, said emitter layer having a light receiving face, a plurality of conductive grid patterns on said face in ohmic contact therewith, each pattern including a plurality of substantially parallel electrically conductive elongated grid members in spaced nested relationship, each grid member terminating at first and seconds ends at the peripheral edge of said face, said grid members being interconnected at said ends by an electrical conductor disposed along said peripheral edge, each grid member being approximately "V" shaped with the apices of the "V's" lying on a straight line which intersects said conductor, the spacing between different pairs of said members being different, the spacing between those members whose apices are closest to the electrical conductor being the greatest.

7. The cell of claim 6 wherein said patterns are identical mirror images of each other.

8. The cell of claim 6 wherein the spacing of said members in a pattern is substantially the same.

9. The cell of claim 6 wherein said layers are square, the apex of each member in a pattern lying on a diagonal of said square, the two legs of each member between its apex and respective end intersecting at right angles at that apex.

10. The cell of claim 9 including four identical grid patterns with the apices of two grid patterns on a diagonal, the apices of one of the two patterns pointing toward and facing the apices of the other of the two grid patterns.

11. The cell of claim 6 including a first pair of patterns whose apices lie on a pair of lines intersecting at a first point, a second pair of patterns spaced from the first pair, the apices of said second pair lying on a pair of lines intersecting at a second point spaced from said first point.

12. The cell of claim 6 including at least three patterns, the apex straight line of each pattern intersecting at a common point.

* * * * *